(12) United States Patent
Igaue et al.

(10) Patent No.: US 6,472,716 B2
(45) Date of Patent: Oct. 29, 2002

(54) SEMICONDUCTOR DEVICE WITH A WELL WHEREIN A SCALING DOWN OF THE LAYOUT IS ACHIEVED

(75) Inventors: Futoshi Igaue, Hyogo (JP); Katsumi Dosaka, Hyogo (JP)

(73) Assignees: Mitsubishi Denki Kabushiki Kaisha, Tokyo (JP); Mitsubishi Electric Engineering Company Limited, Tokyo (JP)

(*) Notice: Subject to any disclaimer, the term of this patent is extended or adjusted under 35 U.S.C. 154(b) by 0 days.

(21) Appl. No.: 09/961,190

(22) Filed: Sep. 24, 2001

(65) Prior Publication Data

US 2002/0135022 A1 Sep. 26, 2002

(30) Foreign Application Priority Data

Mar. 22, 2001 (JP) ......................................... 2001-082501

(51) Int. Cl.[7] .......................... H01L 29/76; H01L 29/94; H01L 31/062; H01L 31/113; H01L 31/119
(52) U.S. Cl. ........................ 257/371; 257/372; 257/394; 257/401
(58) Field of Search ................................ 257/371, 372, 257/394, 401

(56) References Cited

U.S. PATENT DOCUMENTS

| | | | | |
|---|---|---|---|---|
| 5,739,572 A | * | 4/1998 | Noguchi | 257/371 |
| 6,218,708 B1 | * | 4/2001 | Burr | 257/372 |
| 6,258,641 B1 | * | 7/2001 | Wong et al. | 438/199 |

FOREIGN PATENT DOCUMENTS

JP          10-308501         11/1998

OTHER PUBLICATIONS

Related U.S. patent application Ser. No. 09/663,717, filed Sep. 18, 2000 (Our Ref. No. 49657–807).

* cited by examiner

Primary Examiner—Ngâ V. Ngô
(74) Attorney, Agent, or Firm—McDermott, Will & Emery

(57) ABSTRACT

A shallow P well and a deep P well are formed in the surface of a P type semiconductor substrate so as to partially overlap each other and these wells are surrounded by an N well, a deep bottom N type well and a connection N well. The impurity concentration of this overlapping region is higher than the impurity concentration of the P well or of the deep P well and a P[+] type region is formed in the surface of the overlapping region. A potential (VBB) different from the ground potential is applied to the P[+] type region. The P[+] type region is formed in overlapping region and, thereby, the layout of the semiconductor device can be scaled down.

16 Claims, 18 Drawing Sheets

WORD LINE DRIVER    MEMORY CELL

US 6,472,716 B2

SEMICONDUCTOR DEVICE WITH A WELL WHEREIN A SCALING DOWN OF THE LAYOUT IS ACHIEVED

BACKGROUND OF THE INVENTION

1. Field of the Invention

The present invention relates to a semiconductor device, in particular, to a semiconductor device with a well wherein a scaling down of the layout is achieved.

2. Description of the Background Art

A dynamic random access memory (hereinafter referred to as "DRAM") will be described as an example of a conventional semiconductor device. FIGS. 17 and 18 show a border part between a memory cell region B and a peripheral circuit region A (sense amplifiers), and a region in the vicinity thereof, in a DRAM.

As shown in FIGS. 17 and 18, a shallow P well 123 and a deep P well 124 are, respectively, formed in the surface of a P type semiconductor substrate 101. A deep bottom N type well 102 is formed in a region beneath shallow P well 123 and deep P well 124. In addition, an N well 121 is formed in the surface of P type semiconductor substrate 101 adjoining a side of shallow P well 123.

A connection N well 122 is formed in a region between N well 121 and deep bottom N type well 102 so as to electrically connect the two. In addition, a shallow P well 120 is formed in a region on the side opposite to shallow P well 123 with N well 121 placed between them.

Shallow P well 123 and deep P well 124 are surrounded by N well 121, deep bottom N type well 102 and connection N well 122, and, thereby, a potential different from that of shallow P well 120 is applied thereto. In this case, a $P^+$ type region 130 is formed in the surface of shallow P well 120 so that a ground potential (GND) is applied to this $P^+$ type region 130. Then, a $P^+$ type region 132 is formed in the surface of shallow P well 123 so that a potential (VBB) that is different from the ground potential is applied to this $P^+$ type region 132. In addition, an $N^+$ type region 131 is formed in the surface of N well 121 so that a predetermined potential (VPP) that is different from the other two potentials is applied to this $N^+$ type region 131.

A transistor that includes N-+ type source and drain regions 139a and 139b as well as a gate electrode part 140 is formed on the surface of deep P well 124. This transistor is a memory cell transistor in memory cell region B.

A transistor that includes $P^+$ type source and drain regions 135a and 135b as well as a gate electrode part 136 is formed on the surface of N well 121. A transistor that includes $N^+$ type source and drain regions 137a and 137b as well as a gate electrode part 138 is formed on surface of shallow P well 123. These transistors are transistors in the peripheral circuit region (sense amplifiers).

Next, FIGS. 19 and 20 show a border part between a memory cell region B and a peripheral circuit region A (word line drivers), and a region in the vicinity thereof, in a DRAM. As shown in FIGS. 19 and 20, a shallow P well 123, a deep P well 124, an N well 121, a deep bottom N type well 102, a connection N well 122 and a shallow P well 120 are, respectively, formed in a P type semiconductor substrate 101 in the same manner as is each well shown in FIG. 18.

A $P^+$ type region 150 is formed in the surface of shallow P well 120 so that a ground potential (GND) is applied to this $P^+$ type region 150. Then, a $P^+$ type region 152 is formed in the surface of shallow P well 123 so that a potential (VBB) which is different from the ground potential is applied to this $P^+$ type region 152. In addition, an $N^+$ type region 151 is formed in the surface of N well 121 so that a predetermined potential (VPP) that is different from the other two potentials is applied to this $N^+$ type region 151.

A transistor that includes $N^-$ type source and drains regions 139a and 139b as well as a gate electrode part 140 is formed on the surface of deep P well 124. This transistor is a memory cell transistor in memory cell region B.

A transistor that includes $N^+$ type source and drain regions 162a and 162b as well as a gate electrode part 163 is formed on the surface of shallow P well 123. A transistor that includes $N^+$ type source and drain regions 160a and 160b as well as a gate electrode part 161 is formed on the surface of shallow P well 120. These transistors are transistors in peripheral circuit region A (word line drivers).

In this manner, in the above described DRAM, shallow P well 123 is surrounded by N well 121, deep bottom N type well 102 and connection N well 122 and, thereby, a predetermined potential (VBB) that is different from the potentials applied to shallow P well 120 or to N well 121 is applied thereto. This predetermined potential (VBB) is applied to $P^+$ type regions 132 and 152 which are formed in shallow P well 123. In addition, because deep P well 124 and shallow P well 123 are formed so as to partially overlap each other, the two are electrically connected and the potential of deep P well 123 is also fixed at predetermined potential (VBB).

On the other hand, P well 120 is fixed at the ground potential. P well 120 is formed in a region outside of the region which is surrounded by and includes N well 121, deep bottom N type well 102 and connection N well 122 and is formed so as to adjoin a series of deep N type wells including N well 121, connection N well 122 and deep bottom N type well 102.

In the above described conventional DRAM, however, the following problems arise.

As described above, in order to apply a predetermined potential (VBB) to shallow P well 123 and to deep P well 124, $P^+$ type regions 132 and 152 are formed in shallow P well 123 for the application of that potential. Therefore, it is necessary to secure a region for forming these $P^+$ type regions 132 and 152 in shallow P well 123.

In addition, at the time when forming these $P^+$ type regions 132 and 152, it is necessary to secure predetermined spaces between the $N^+$ type source and drain regions 132a, 162a of the transistor, located in the vicinity thereof, and $P^+$ type region 132. Then, it is necessary to secure a predetermined space between N well 121 located in the vicinity of $P^+$ type region 132 and $P^+$ type region 132 itself.

As a result, there is a limit to the scaling down of the area occupied by shallow P well 123 in P type semiconductor substrate 101 and this has become one factor that hampers the scaling down of the layout of a DRAM.

In addition, as described above, P well 120 is formed so as to adjoin a series of deep N type wells including N well 121, connection N well 122 and deep bottom N type well 102. Deep bottom N well 102 and connection N well 122 are formed by injecting ions of a predetermined conductive type, such as phosphorous, into P type semiconductor substrate 101. At this time, dispersion of the location where the well is formed occurs in the case of a comparatively deep well due to the relationship between the dispersion of the direction of ion injection and the depth of the well. Therefore, in order to maintain electrical insulation, it is necessary to secure a predetermined distance, space X, between $P^+$ type region 130 formed in shallow P well 120 and the adjoining series of N wells (or the end part of shallow P well 120).

As a result, there is a limit to the reduction of space X between P$^+$ type region 130 and the series of N wells and this has become another factor that hampers the scaling down of the layout of a DRAM.

SUMMARY OF THE INVENTION

The present invention is provided in order to solve the above described problems and has the purpose of providing a semiconductor device wherein a scaling down of the layout can be easily achieved.

One semiconductor device according to the present invention includes a semiconductor substrate of a first conductive type that has a main surface, a first well region of the first conductive type, a second well region of the first conductive type and a first voltage application part. The first well region of the first conductive type is formed at a predetermined depth from the main surface of the semiconductor substrate and is provided with a first semiconductor element. The second well region of the first conductive type is formed so as to partially overlap an edge part of the first well region in the main surface of the semiconductor substrate and is provided with a second semiconductor element that is placed shallower than the first well region. The first voltage application part is formed in a region where the first well region and the second well region overlap and a voltage is applied thereto in order to fix the first well region and the second well region at a predetermined potential.

In this configuration, the voltage application part is formed in a region where the first well region and second well region overlap and, thereby, the region for forming such first voltage application part can be eliminated from the second well region, in contrast to the case where such first voltage application part is formed in the second well region, so that the distance between the second semiconductor element and the edge part of the second well region can be reduced. As a result, the scaling down of the layout of a semiconductor device can be achieved.

It is preferable for the impurity concentration of the region where the first well region and the second well region overlap and where such first voltage application part is formed to be higher than the impurity concentration of the first well region and the second well region from which the overlapping region is eliminated.

Thereby, a predetermined potential can be applied without fail from the first voltage application part to the first well region and the second well region through the overlapping region without having an interim part where the electrical resistance is high.

In addition, preferably, the first semiconductor element is a memory cell transistor in a memory cell of a dynamic random access memory, while the second semiconductor element is a transistor arranged in the periphery of the memory cell.

In this case, the memory cell transistor is formed in the first well region which is deeper than the second well region while the transistor arranged in the vicinity of the memory cell is formed in the second well region. Thereby, particularly a leak current from the first well region to the to a region outside thereof or a leak current from the memory cell transistor to the first well region decreases so that the data maintenance characteristics of the memory cell improve.

More preferably, a third well region of the first conductive type formed in the main surface of the semiconductor substrate on the side opposite to the first well region at a distance from the second well region, a fourth well region of the second conductive type formed in a region ranging, at least, from the surface of a region of the semiconductor substrate located between the second well region and the third well region to a region of the semiconductor substrate located beneath the first well region and the second well region in order to electrically insulate the first and the second well regions from the third well region, and a second voltage application part, which is formed in the third well region and to which a voltage for fixing the third well region at a predetermined potential is applied, are provided wherein the deeper part of the fourth well region located on the side of the third well region is recessed in the direction away from the third well region.

In this case, the depth of the fourth well region becomes shallower in the part adjoining the third well region than it is in the other parts. Thereby, the dispersion of the location of the fourth well region decreases at the time when the fourth well region is formed so that the distance between the second voltage application part formed in the third well region and the edge part of the third well region can be shortened. Thereby, an additional scaling down of the layout can be achieved.

Concretely, it is preferable for the distance from the third well region to the recessed part located deeper in the fourth well region to be a distance where no current leaks between the region of the semiconductor substrate located beneath the third well region and the region of the semiconductor substrate located between the second well region and the fourth well region.

In this case, the scaling down of the layout of the semiconductor device can be achieved without affecting the operations of the first semiconductor element and the second semiconductor element under the condition where the first and the second well regions and the third well region are fixed, respectively, at different potentials.

Another semiconductor device according to the present invention is provided with a semiconductor substrate of a first conductive type which has a main surface, a first well region of the first conductive type, a voltage application part and a second well region of a second conductive type. The first well region of the first conductive type is formed at a predetermined depth from the main surface of the semiconductor substrate. The voltage application part is formed in the first well region and a voltage is applied for fixing the first well region at a predetermined potential. The second well region of the second conductive type is formed in the main surface of the semiconductor substrate so as to adjoin the first well region and is deeper than the first well region. Then, the deeper part of the second well region located on the side of the first well region is recessed in the direction away from the first well region.

In this configuration the depth of the second well region becomes shallower in the part adjoining the first well region than it is in the other parts. Thereby, the dispersion of the location of the second well region decreases at the time when the second well region is formed so that the distance between the voltage application part formed in the first well region and the edge part of the first well region can be shortened. As a result, the scaling down of the layout of the semiconductor device can be achieved.

The second well region is preferably formed so as to surround a predetermined region in the semiconductor substrate from above, from the main surface, and from below, from the inside of the semiconductor substrate, in order to electrically insulate the predetermined region from the first well region, and the distance from the first well region to the recessed part located deeper in the second well region is a distance where no current leaks between the region in the semiconductor substrate located beneath the first well region and the predetermined region.

In this case, the scaling down of the layout of the semiconductor device can be achieved without affecting the operations of an element formed in, for example, the predetermined region under the condition where the first well region and the predetermined region are fixed, respectively, at different potentials.

As a more concrete form of the second well region, it is desirable for the second well region to include an upper well region located in the vicinity of the main surface, a bottom well region that extends toward the side opposite to the first well region side and that is formed in a region at a predetermined depth from the main surface and a connection well region for electrically connecting the upper well region and the bottom well region wherein the part located deeper includes parts of the bottom well region and the connection well region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
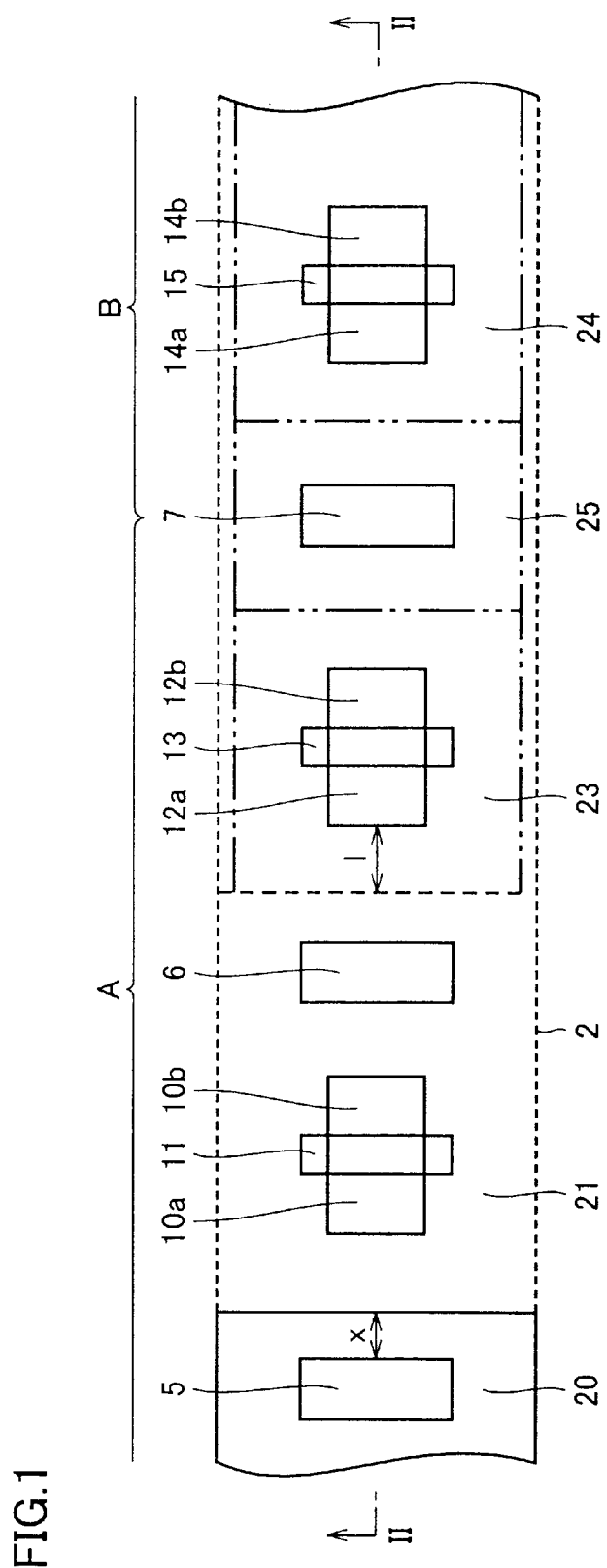
FIG. 1 is a plan view of a semiconductor device according to a first embodiment of the present invention.
Figure 2:
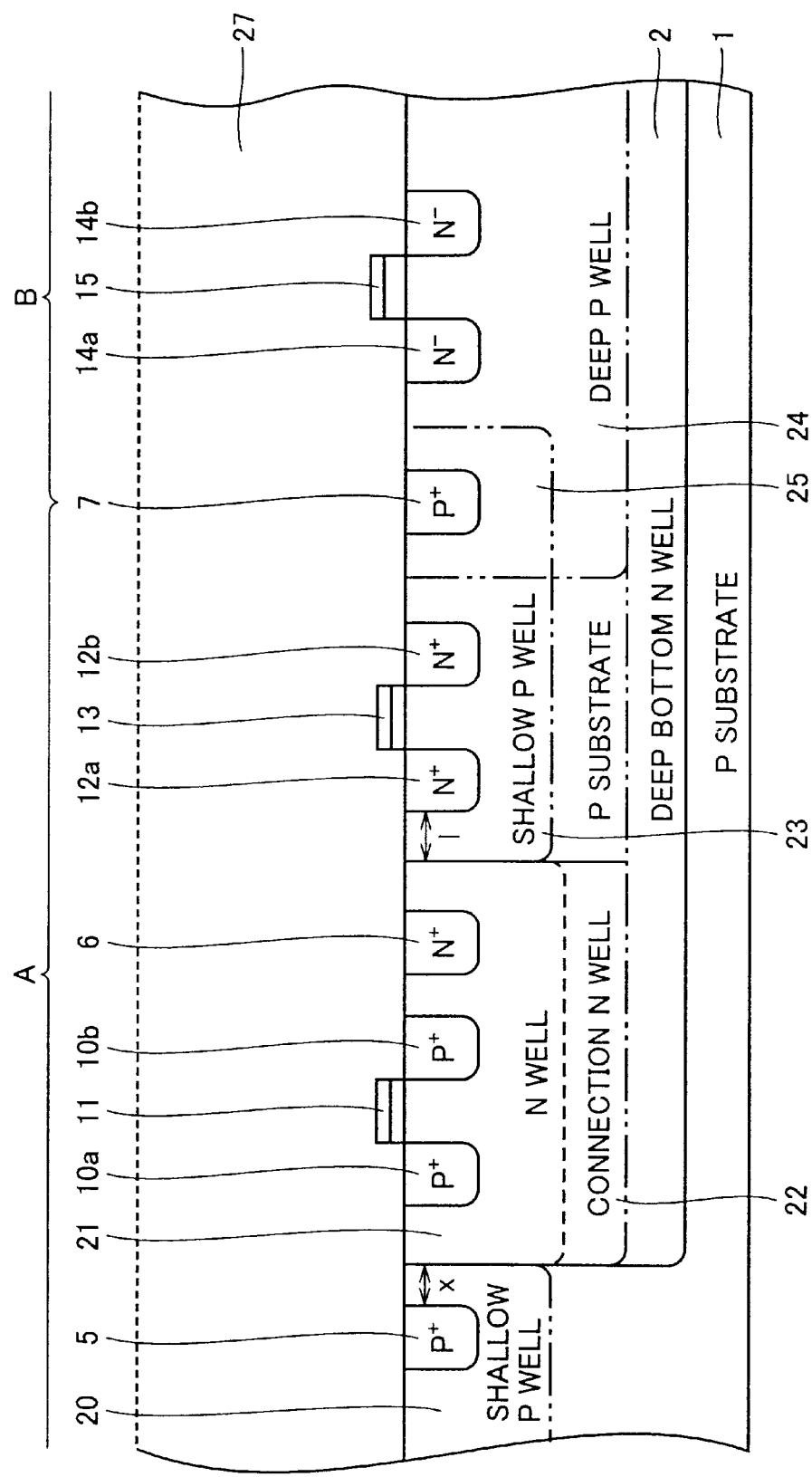
FIG. 2 is a cross section view along line II—II of the semiconductor device shown in FIG. 1 according to the first embodiment.

A DRAM is cited as an example and is described as a semiconductor device according to the first embodiment of the present invention. FIGS. 1 and 2 show a border part that is between the memory cell region B and the peripheral circuit region A (sense amplifiers) as well as a region in the vicinity thereof in the DRAM.

As shown in FIGS. 1 and 2, a shallow P well 23 and a deep P well 24 are, respectively, formed in the surface of a P type semiconductor substrate 1. A deep bottom N type well 2 is formed in a region beneath shallow P well 23 and deep P well 24. In addition, an N well 21 is formed in the surface of P type semiconductor substrate 1 next to shallow P well 23.

A connection N well 22 is formed in a region between N well 21 and deep bottom N type well 2 for electrically connecting these two. In addition, a shallow P well 20 is formed in a region on the side opposite to shallow P well 23 with N well 21 placed in between. In addition, shallow P well 23 and deep P well 24 are formed so as to partially overlap each other and an overlapping region 25 is formed in this part. The impurity concentration of overlapping region 25 is higher than the impurity concentration of P well 23 or of deep P well 24.

Shallow P well 23 and deep P well 24 are surrounded by N well 21, deep bottom N type well 2 and connection N well 22 and, thereby, a potential different from that of shallow P well 20 can be applied thereto.

In this case, a $P^+$ type region 5 is formed in the surface of shallow P well 20 and the ground potential (GND) is applied to this $P^+$ type region 5. An $N^+$ type region 6 is formed in the surface of N well 21 and a predetermined potential (VPP) is applied to this $N^+$ type region 6.

Then, a $P^+$ type region 7 is formed in the surface of overlapping region 25 and a potential (VBB) which is different from the ground potential is applied to this $P^+$ type region 7.

A memory cell formed in memory cell region B is formed by including a capacitor for storing the charge and a memory cell transistor as a switching element which gives the charge to and removes the charge from this capacitor. The transistor that is formed of the surface of deep P well 24 and that includes N⁻ type source and drain regions 14a and 14b as well as gate electrode part 15 is one of the memory cell transistors.

Figure 4:
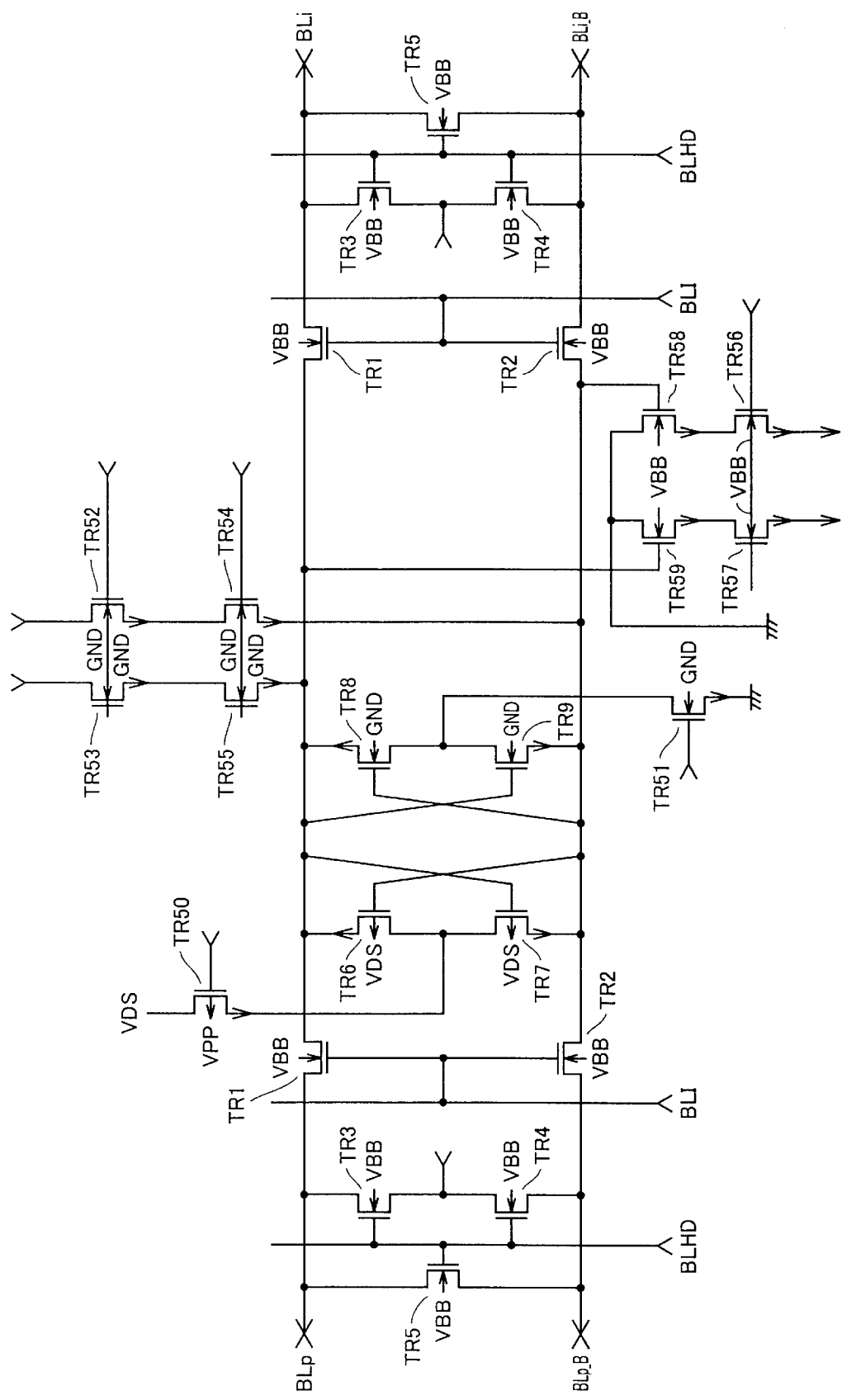
FIG. 4 is a diagram showing an equivalent circuit of a sense amplifier according to the first embodiment.

In this case, a sense amplifier for amplifying the input/output of the data to the memory cell is formed in peripheral circuit region A. An example of an equivalent circuit of this sense amplifier is shown in FIG. 4. As shown in FIG. 4, the sense amplifier is formed of a CMOS type balanced style flip-flop circuit wherein transistors TR6 and TR7, forming a PMOS sense amplifier, and transistors TR8 and TR9, forming an NMOS sense amplifier, are provided.

In addition, the sense amplifier is provided with transistors TR1 and TR2 as transfer gates for transferring the data of the bit line into the sense amplifier and to the IO line and with transistors TR3, TR4 and TR5 for bit line equalizing. In addition, transistors TR56 and TR57 are provided as read out gates for reading out the data within the sense amplifier.

Then, a transistor TR50 for driving transistors TR6 and TR7, as well as a transistor TR51 for driving transistors TR8 and TR9, are, respectively, provided. In addition, transistors TR52 to TR55 are provided as write in gates for writing data into the sense amplifier.

Figure 3:
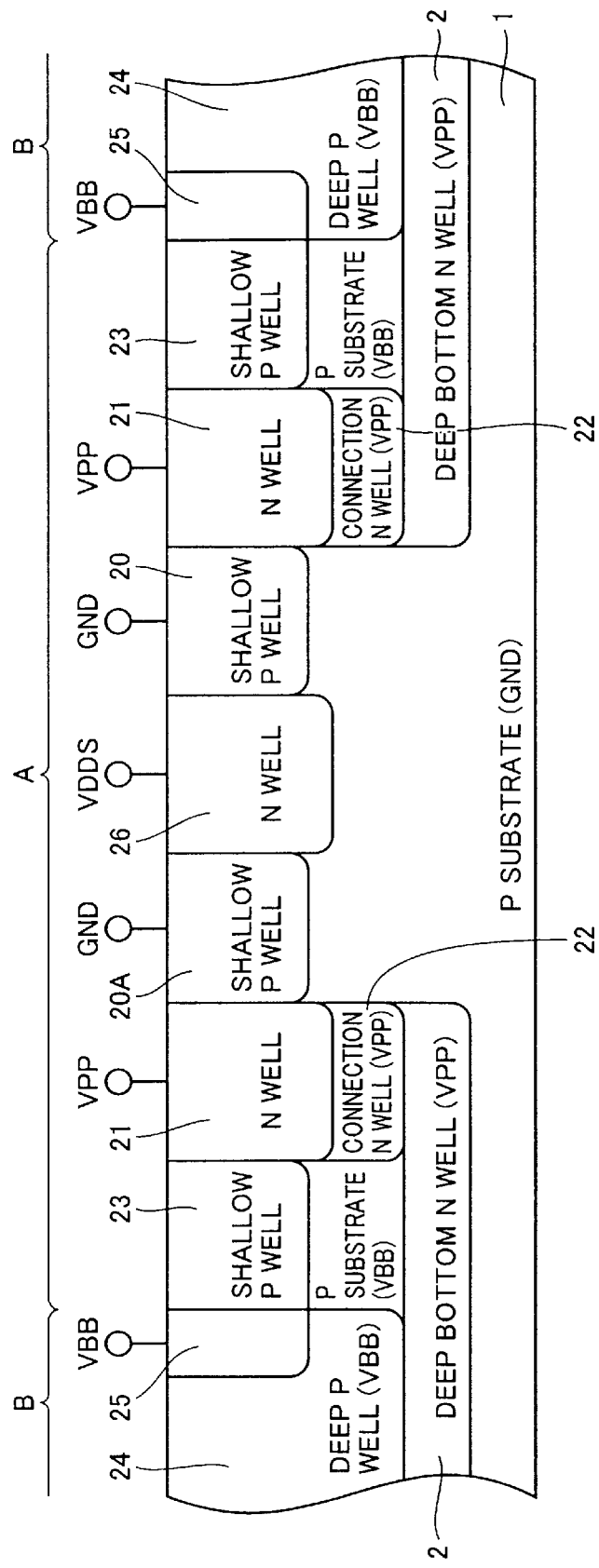
FIG. 3 is a cross section view for describing the arrangement of a memory cell region and a peripheral circuit region in the semiconductor device according to the first embodiment.

As shown in FIGS. 2 and 3, a transistor that is formed on the surface of shallow P well 23 and that includes N⁺ type source and drain regions 12a and 12b as well as a gate electrode part 13 corresponds to transistors TR1 to TR5 among the above described transistors. In addition to transistors TR1 to TR5, transistors TR56 and TR57 are formed on the surface of another shallow P well 23 shown in FIG. 3.

A transistor that is formed on the surface of N well 21 and that includes P⁺ type source and drain regions 10a and 10b as well as a gate electrode part 11 corresponds to transistor TR50. Transistors TR8,TR9 and TR51 are formed in shallow P well 20. Transistors TR6 and TR7 are formed in N well 26. In addition, transistors TR52 to TR55 are formed in one of shallow P wells 20A shown in FIG. 3.

As described above, the memory cell transistor is formed in deep P well 24. In the case that P well 24, wherein this memory cell transistor is formed, is shallow, the contact area with another adjoining N well (not shown) becomes small and the impurity concentration of the P well becomes comparatively high and, therefore, a leak current from P well 24 to the N well increases. In addition, because the impurity concentration of the P well becomes high, a leak current from the source and drain regions 14a and 14b, formed in P well 24, to P well 24 also increases. Thereby, the refreshing characteristics of the memory cells deteriorate because of the junction leak current. Accordingly, it is desirable for a transistor of a memory cell wherein data maintenance characteristics are required, such as in a memory cell, to be formed in a deep P well 24.

Figure 20:
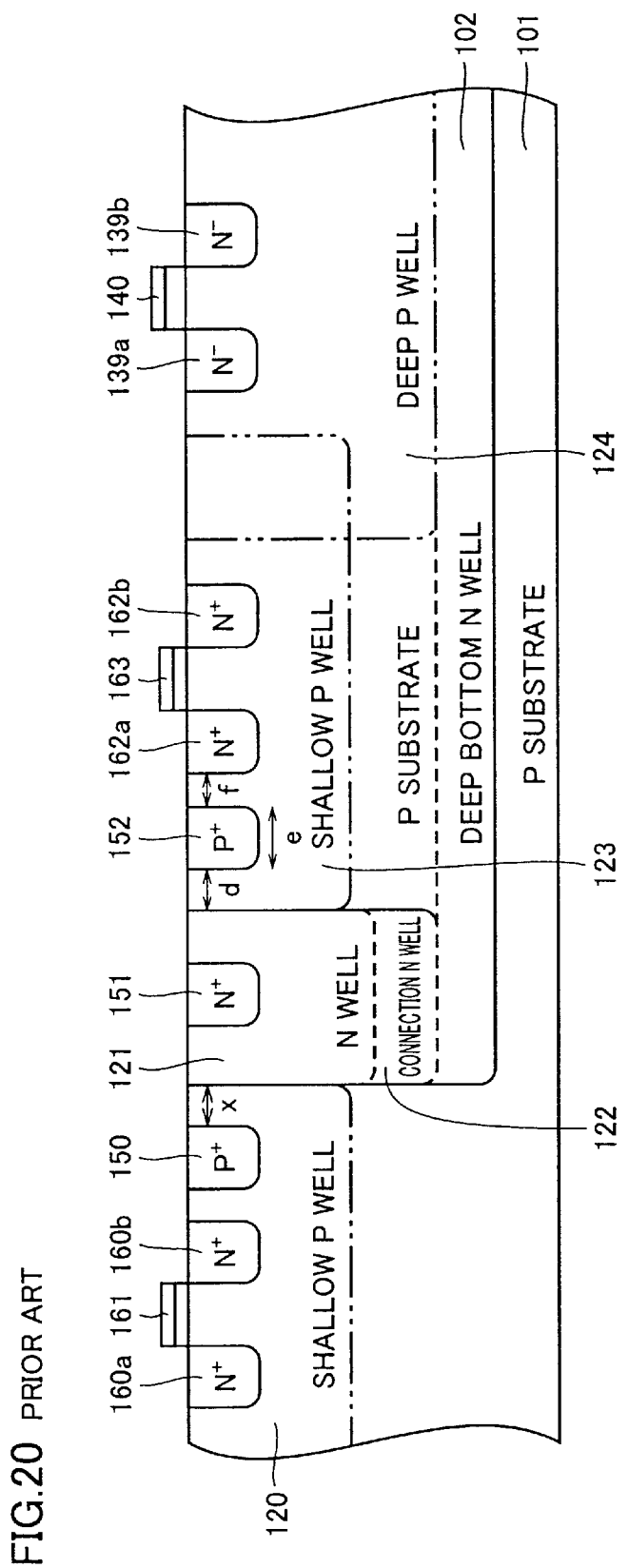
FIG. 20 is a cross section view along line XX—XX of the semiconductor device shown in FIG. 19.

In a conventional DRAM, as shown in FIGS. 20, and the like, P⁺ type region 132 to which a potential is applied for fixing shallow P well 123 and deep P well 124 at a predetermined potential (VBB) is formed in shallow P well 123. In contrast to this, in the above described DRAM, P⁺ type region 7 is formed in overlapping region 25 between shallow P well 23 and deep P well 24.

Shallow P well 23 and deep P well 24 are formed by injecting ions into P type semiconductor substrate 1. At this time, a positional shift occurs, in some cases, between the region where shallow P well 23 is to be formed and the region where deep P well 24 is to be formed due to the shift of a mask or due to the dispersion of the angles of the ion injection so that a region of P type semiconductor substrate 1 becomes located between shallow P well 23 and deep P well 24.

The impurity concentration of this region of P type semiconductor substrate 1 is lower than the impurity concentration of shallow P well 23 or deep P well 24. Therefore, the resistance in this region of P type semiconductor substrate 1 is higher than the resistance in shallow P well 23 or in deep P well 24. As a result, it becomes difficult to maintain the potential of shallow P well 23 and the potential of deep P well 24 at the same potential.

Then, at the time when forming shallow P well 23 and deep P well 24, ion injections are carried out so that both of the wells are intentionally made to partially overlap so as to provide an overlapping region 25 and, thereby, the respective potentials of shallow P well 23 and deep P well 24 can be easily maintained at the same potential.

As shown in FIG. 2, this overlapping region 25 is located in the border part between memory cell region B and peripheral circuit region A. Capacitors (not shown) for storing the charge as information, or the like, are formed in a matrix form in memory cell region B. On the other hand, such capacitors are not formed in peripheral circuit region A. Therefore, a step (absolute step H: see FIG. 18) is generated between memory cell region B and peripheral circuit region A after forming an interlayer insulating film 27.

Then, since a predetermined voltage (VBB) is applied to P⁺ type region 7, a contact hole (not shown) is created in interlayer insulating film 27, and the like, located above P⁺ type region 7 and a conductive material is filled in into this contact hole.

Figure 18:
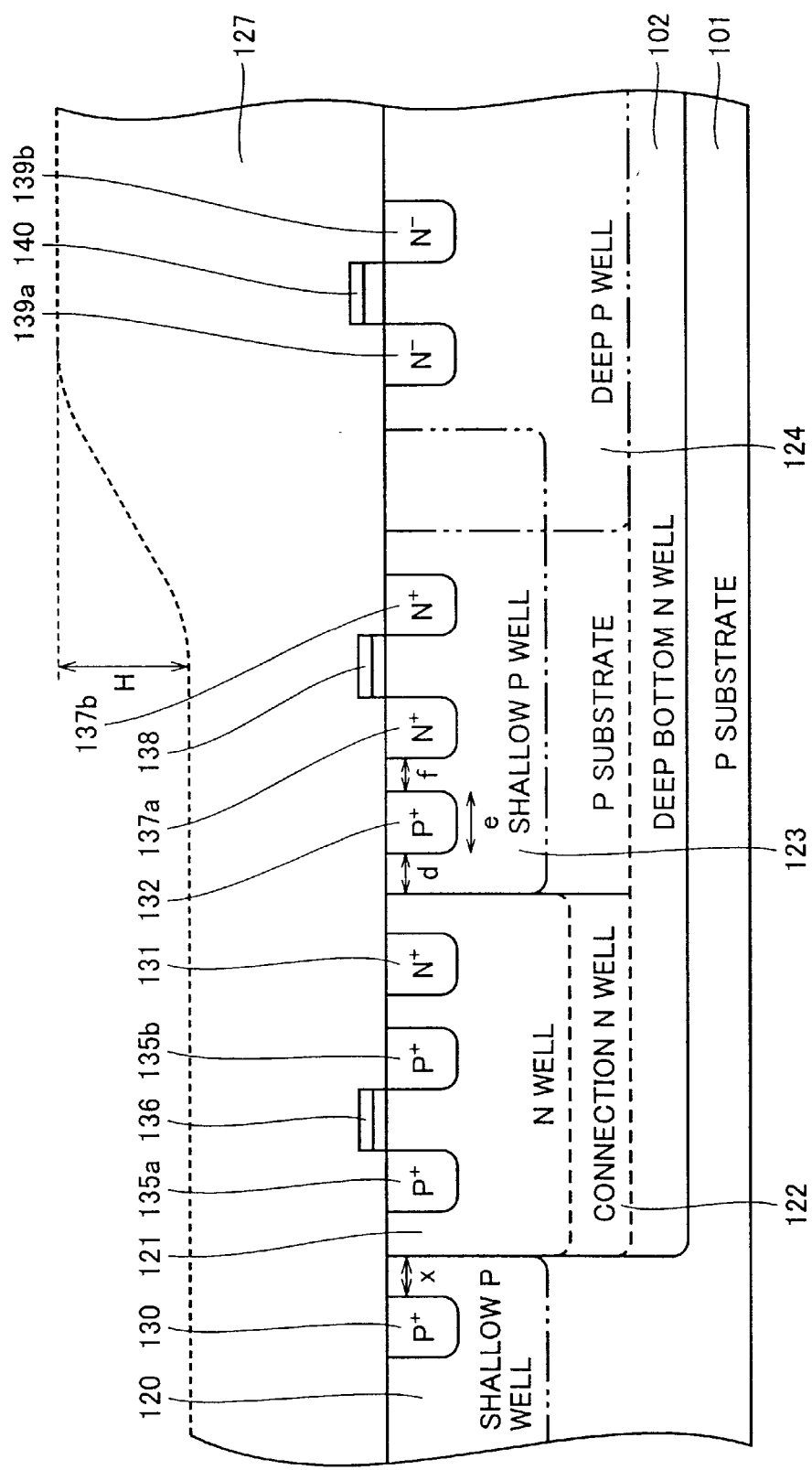
FIG. 18 is a cross section view along line XVIII—XVIII of the semiconductor device shown in FIG. 17.
Figure 19:
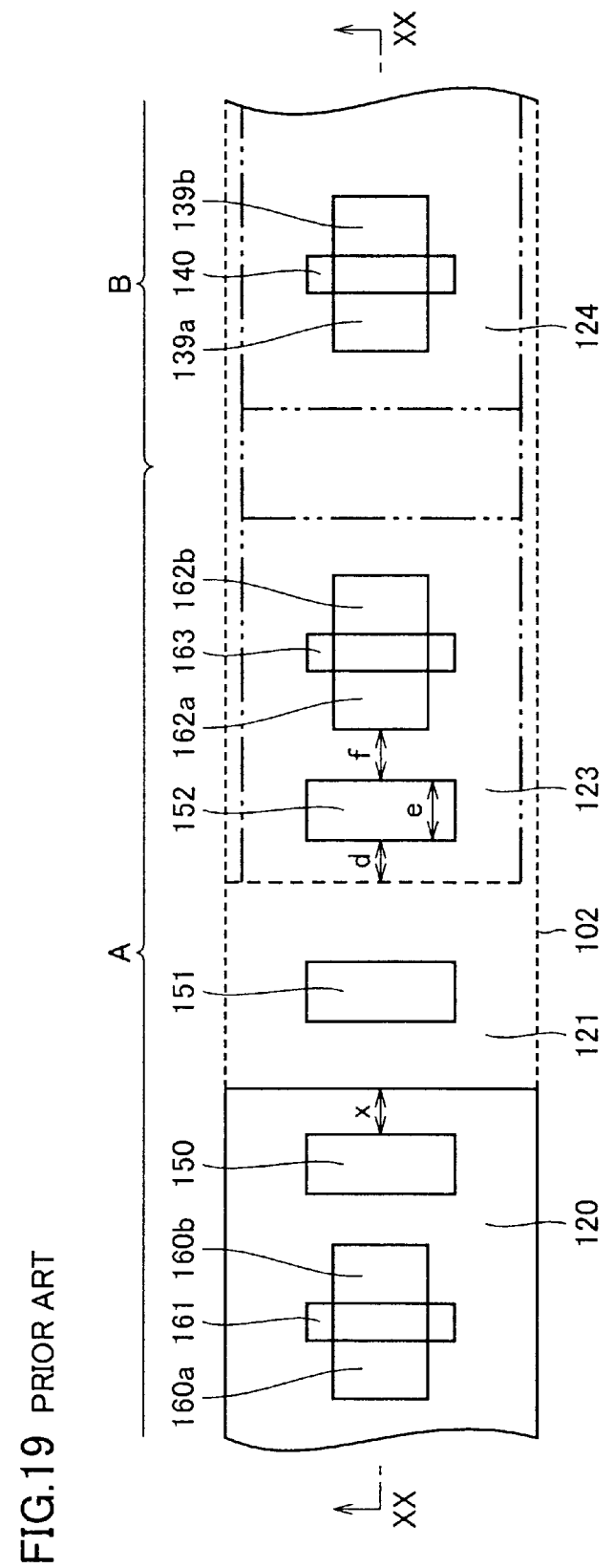
FIG. 19 is a plan view of another semiconductor device according to the prior art.

In order to place the P⁺ type region in overlapping region 25, however, it becomes necessary to create a contact hole in the sloped part of the step of interlayer insulating film 127 in the conventional semiconductor device as shown in FIG. 18. Therefore, the region wherein a contact hole would be created is not flat and the contact hole would become deeper than other contact holes created in peripheral circuit region A. Accordingly, in the conventional semiconductor device it was not considered that a P⁺ type region could be formed in overlapping region 25.

On the other hand, in the semiconductor device according to the present embodiment, as shown in FIG. 2, for example, a chemical mechanical polishing (CMP) is carried out on interlayer insulating film 27 so that the absolute step between memory cell region B and peripheral circuit region A is eliminated so as to make interlayer insulating film 27 flat and, thus, the depth of the contact hole becomes shallower than in the case shown in FIG. 18 and the creation of a contact hole becomes easier. Thereby, it becomes possible to place P⁺ type region 7 in overlapping region 25.

The following effects can be gained in this semiconductor device by forming P⁺ type region 7 in overlapping region 25.

As shown in FIG. 18, in the case that P⁺ type region 132 is formed in shallow P well 123 in the conventional semiconductor device it is necessary to secure the distance f between P⁺ type region 132 and the N⁺ type source and drain region 137a, to secure distance d between P⁺ type region 132 and N well 121 and to secure width e of P⁺ type region 132 itself as a space between N⁺ type source and drain region 137a and N well 121 (or the edge part of shallow P well 12).

On the other hand, as shown in FIG. 2, it becomes sufficient to secure only distance l as a space between N⁺ type source and drain region 12a and N well 21 by forming P⁺ type region 7 in overlapping region 25. This distance l is significantly smaller than the sum of the above distances f, d and e.

As a result, in the present semiconductor device, in comparison with the conventional device, the size of distance (d+e+f−1) can be scaled down in the border part between memory cell region B and peripheral circuit region A and in the vicinity thereof.

Figure 5:
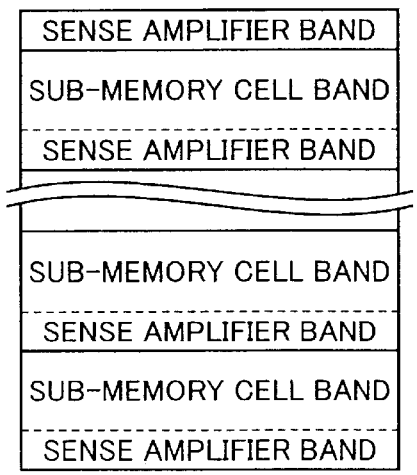
FIG. 5 is a plan view showing an example of the arrangement of a sense amplifier band and a sub-memory band according to the first embodiment.

In the case of a DRAM, as for memory cell region B and peripheral circuit region A, sub-memory bands as memory cell region B and the sense amplifier bands as peripheral circuit region A are arranged in an array form as shown in, for example, FIG. 5. Therefore, in the entirety of the present semiconductor device, the size of the distance gained by multiplying distance (d+e+f−1) by the number of the border parts between a sub-memory band and a sense amplifier band can be scaled down.

For example, in the case that memory cells of 8 Mb with the capacitance of a sub-memory cell band being 1 Mb are formed, the size of (8+1)×distance (d+e+f−1) (size in the longitudinal direction in FIG. 5) can be scaled down.

Figure 6:
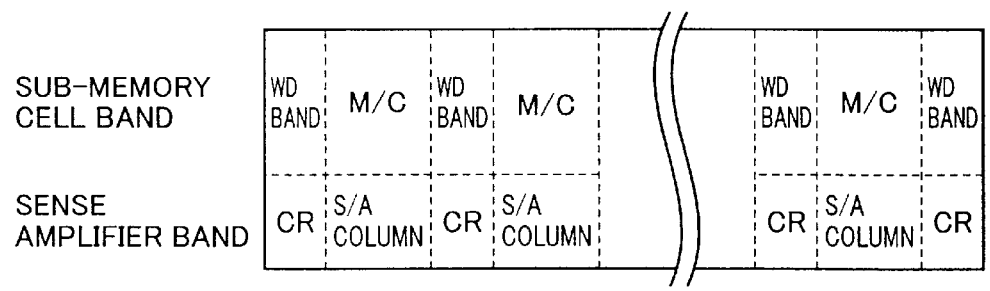
FIG. 6 is a plan view showing an example of respective configurations of the sense amplifier band and the sub-memory band according to the first embodiment.

In addition, as shown in FIG. 6, memory cell arrays (M/C) and word line driver bands (WD) are arranged in a sub-memory band while sense amplifiers (S/A columns) and cross points (CR) are arranged in a sense amplifier band. In the border parts between these memory cell arrays and the word line driver bands, the size of distance (d+e+f−1) per one border part can also be scaled down.

For example, in the case that sub-memory bands of the capacitance of 1 Mb are formed with the capacitance of memory cells being 128 kb, the size of (8+1)×distance (d+e+f−1) (size in the lateral direction in FIG. 6) can be scaled down so that the size can be scaled down depending on the numbers of the arranged memory cell arrays (M/C) and word line driver bands (WD).

In this manner, the scaling down of the layout of the entire DRAM can be easily achieved so that higher integration and a further increase in the density of the DRAM can be achieved.

Figure 7:
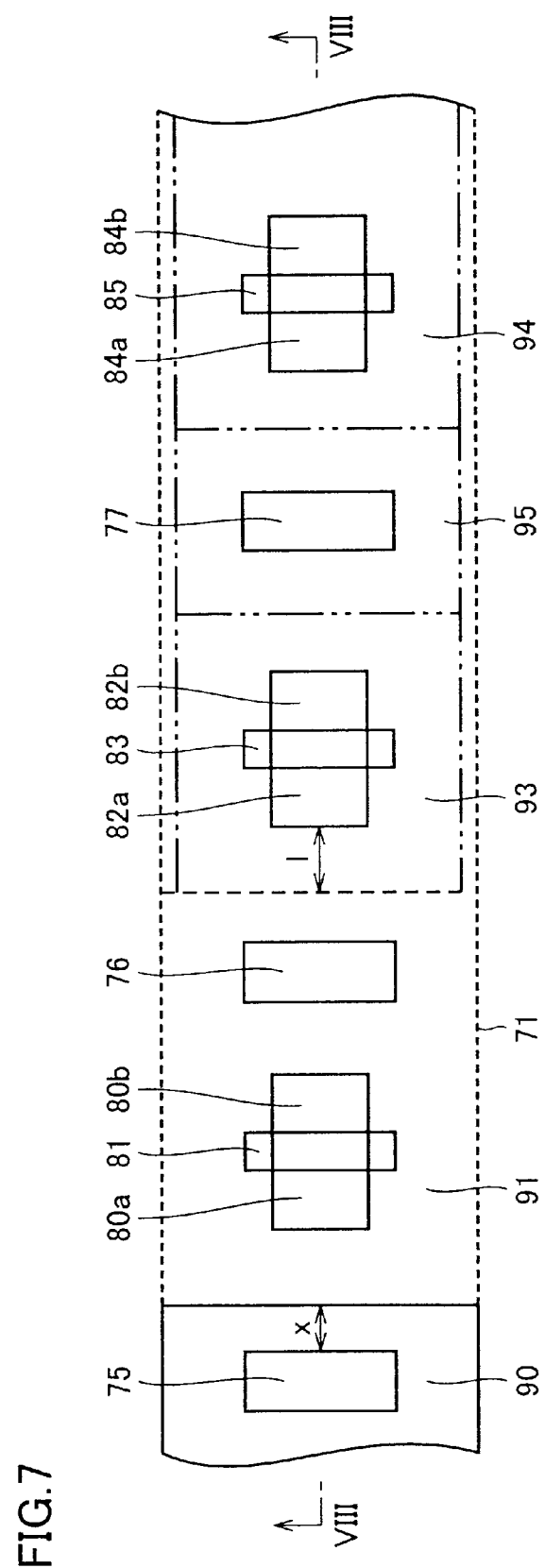
FIG. 7 is a plan view of a semiconductor device according to a modified example according to the first embodiment.
Figure 8:
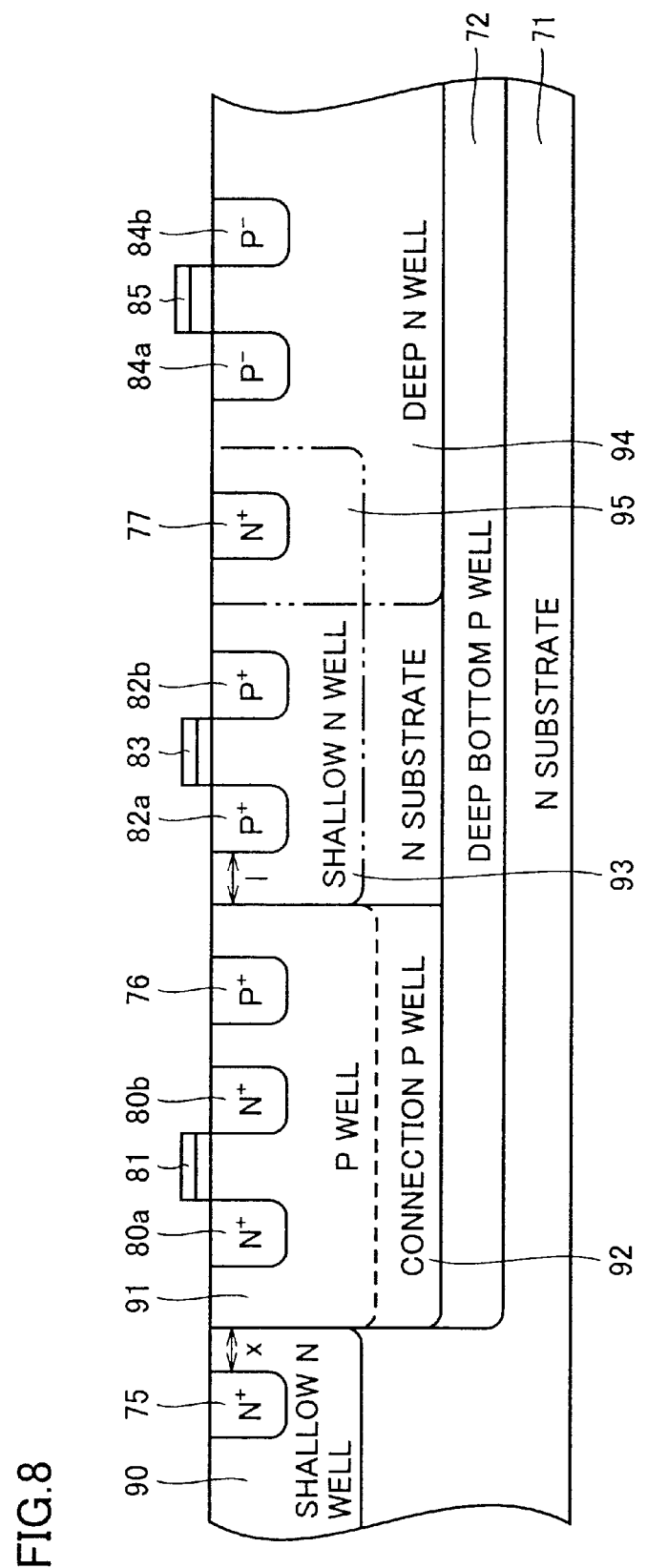
FIG. 8 is a cross section view along line VIII—VIII of the semiconductor device shown in FIG. 7 according to the first embodiment.

Next, a modified example of a semiconductor device is described. As shown in FIGS. 7 and 8, a shallow N well 93 and a deep N well 94 are, respectively, formed in the surface of N type semiconductor substrate 71. A deep bottom P type well 72 is formed in a region beneath shallow N well 93 and deep N well 94. In addition, a P well 91 is formed in the surface of N type semiconductor substrate 71 next to shallow N well 93.

A connection P well 92 is formed in a region between P well 91 and deep bottom P type well 72 for electrically connecting these two. In addition, a shallow N well 90 is formed in a region on the side opposite to shallow N well 93 by placing P well 91 between them. In addition, shallow N well 93 and deep N well 94 are formed so as to partially overlap each other and an overlapping region 95 is formed in this part. The impurity concentration of overlapping region 95 is higher than the impurity concentration of N well 93 or deep N well 94.

A potential different from that of shallow N well 90 is applied to shallow N well 93 and deep N well 94 by being surrounded by P well 91, deep bottom P well 92 and connection P well 92.

An N$^+$ type region 75 is formed in the surface of shallow N well 90. A P$^+$ type region 76 is formed in the surface of P well 91. An N$^+$ type region 77 is formed in the surface of overlapping region 95. Predetermined potentials are applied to, respectively, to N$^+$ type region 75, P$^+$ type region 76 and P$^+$ type region 7.

Then, a transistor which includes N$^+$ type source and drain regions 80a and 80b as well as a gate electrode part 81 is formed on the surface of P well 91. A transistor which includes P$^+$ type source and drain regions 82a and 82b as well as a gate electrode part 83 is formed on the surface of shallow N well 93. A transistor which includes P$^-$ type source and drain regions 84a and 84b as well as a gate electrode part 85 is formed on the surface of deep N well 94.

The modified example of the semiconductor device is gained by inverting the conductive types of each of the components in the above described semiconductor device. In this semiconductor device where the conductive types are inverted, the scaling down of the layout can also be achieved in the same manner as in the above described semiconductor device so as to correspond to higher integration and increase in density.

Second Embodiment

Figure 9:
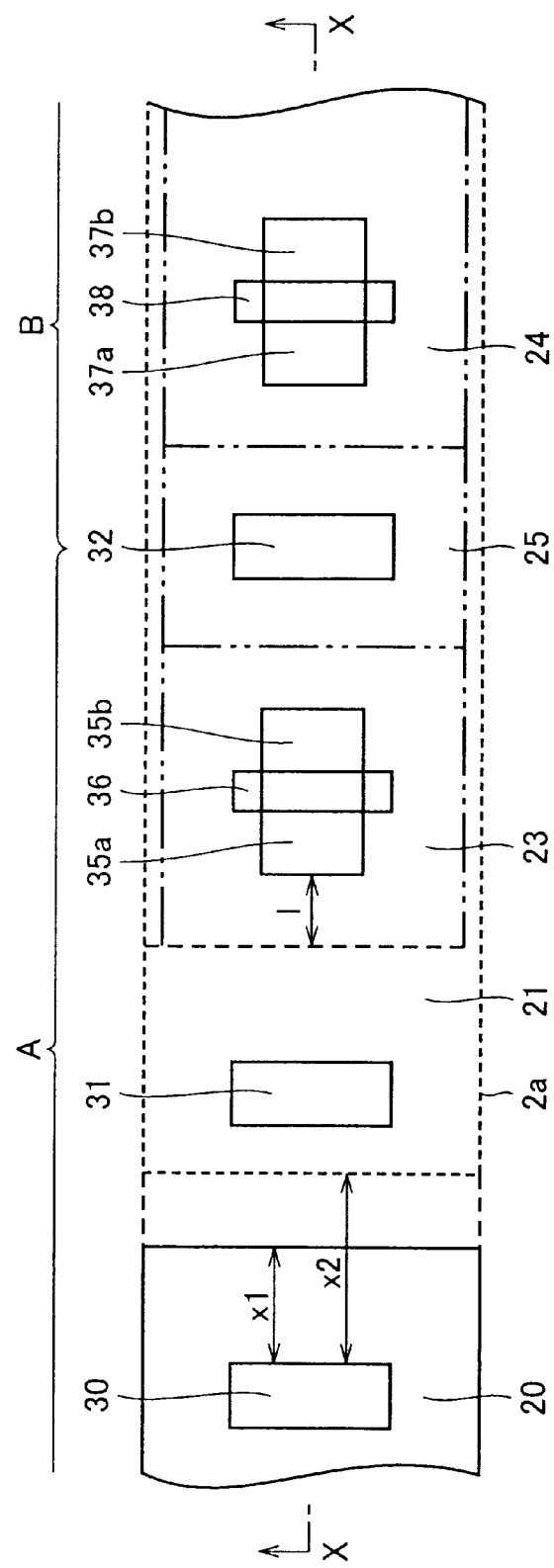
FIG. 9 is a plan view of a semiconductor device according to a second embodiment of the present invention.
Figure 10:
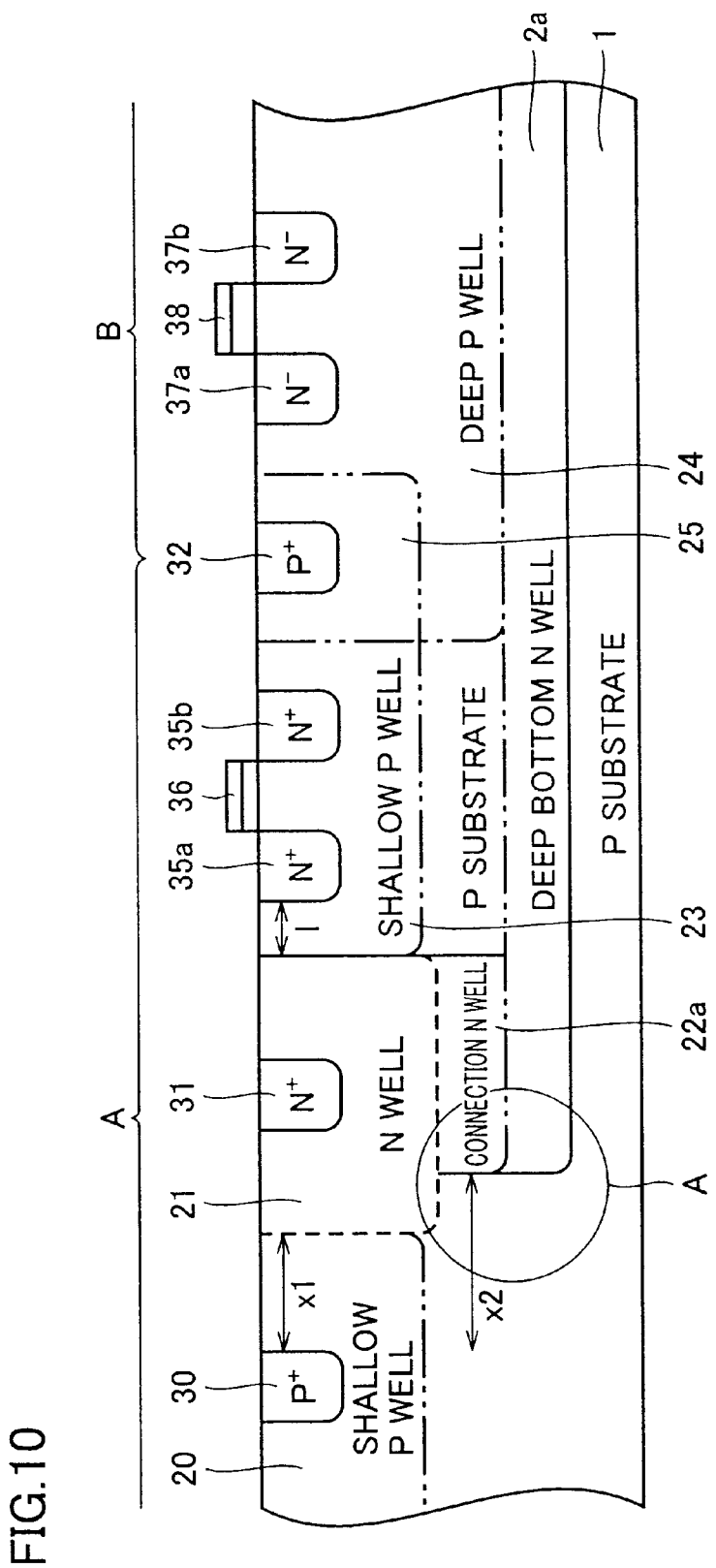
FIG. 10 is a cross section view along line X—X of the semiconductor device shown in FIG. 9 according to the second embodiment.

A semiconductor device according to the second embodiment is described. FIGS. 9 and 10 show a border part between a memory cell region B and a peripheral circuit region A (word line drivers) in a DRAM and a region in the vicinity thereof.

As shown in FIGS. 9 and 10, a shallow P well 23 and a deep P well 24 are, respectively, formed in the surface of a P type semiconductor substrate 1. A deep bottom N type well 2a is formed in a region beneath shallow P well 23 and deep P well 24. In addition, an N well 21 is formed in the surface of P type semiconductor substrate 1 next to shallow P well 23.

A connection N well 22a is formed in a region between N well 21 and deep bottom N type well 2a so as to electrically connect these two. In addition, a shallow P well 20 is formed in a region on the side opposite to shallow P well 23 by placing N well 21 between them. In addition, shallow P well 23 and deep P well 24 are formed so as to partially overlap each other and an overlapping region 25 is formed in this part. The impurity concentration of overlapping region 25 is higher than the impurity concentration of P well 23 or deep P well 24.

A potential different from that of shallow P well 20 is applied to shallow P well 23 and to deep P well 24 by being surrounded by N well 21, deep bottom N type well 2a and connection N well 22a.

In this case, a P$^+$ type region 30 is formed in the surface of shallow P well 20 and the ground potential (GND) is applied to this P$^+$ type region 30. An N$^+$ type region 31 is formed in the surface of N well 21 and a predetermined potential (VPP) is applied to this N$^+$ type region 31.

Then, a P$^+$ type region 32 is formed in the surface of overlapping region 25 and a potential (VBB), which is different from the ground potential, is applied to this P$^+$ type region 32.

As described above, a transistor that is formed on the surface of deep P well 24 and that includes N$^-$ type source and drain regions 37a and 37b as well as gate electrode part 38 is one of the memory cell transistors.

Figure 11:
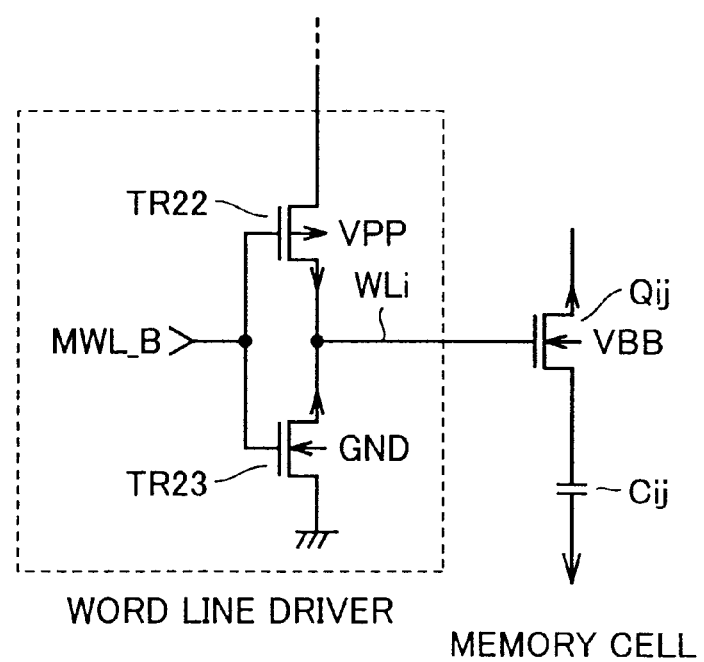
FIG. 11 is a diagram showing an equivalent circuit of a word line driver according to the second embodiment.

In this case, a word line driver for controlling the driving of a memory cell transistor Qij (see FIG. 11) is formed in peripheral circuit region A. An example of an equivalent circuit including this word line driver is shown in FIG. 11. As shown in FIG. 11, transistors TR22 and TR23 are provided as driver transistors in the word line driver.

Figure 12:
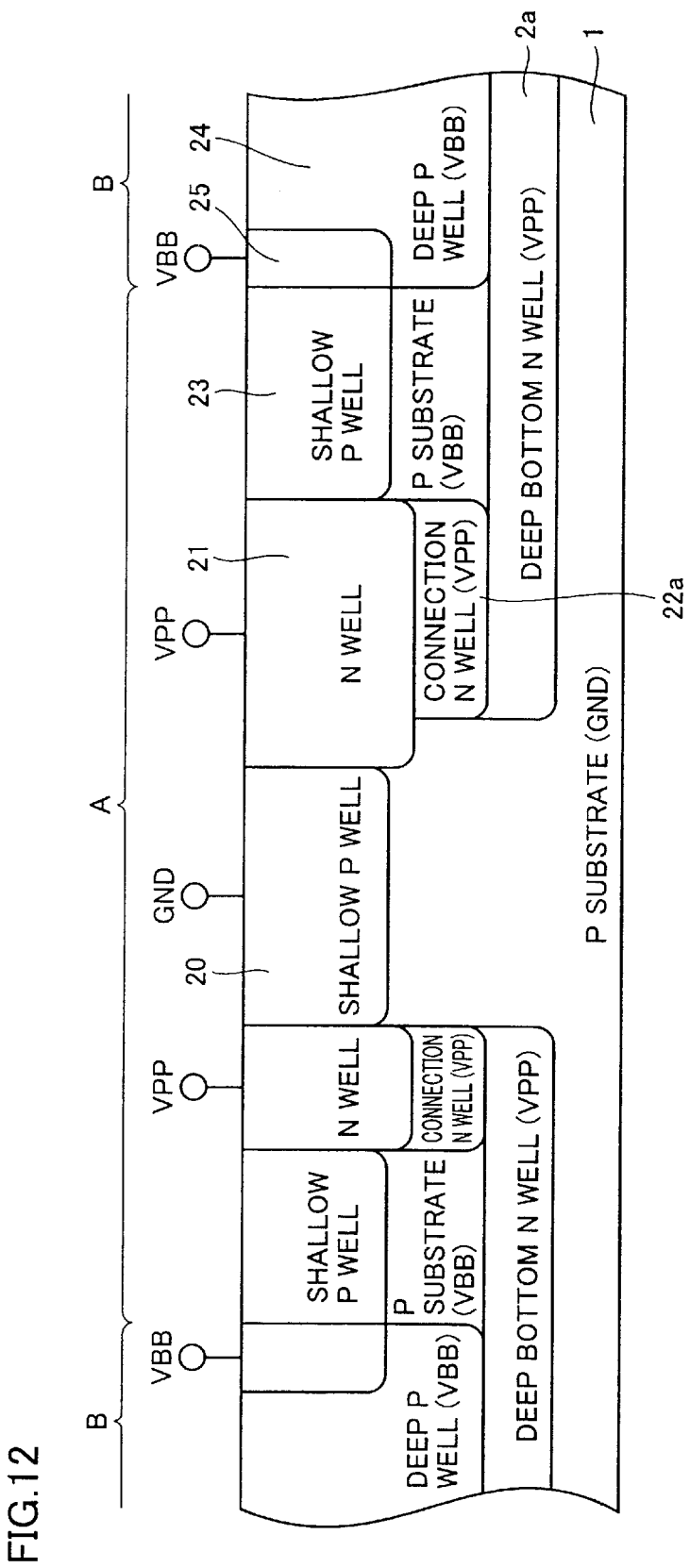
FIG. 12 is a cross section view for describing the arrangement of a memory cell region and a peripheral circuit region in the semiconductor device according to the second embodiment.

As shown in FIGS. 9 and 10, a transistors that is formed on the surface of shallow P well 23 and that includes N$^+$ type source and drain regions 35a and 35b as well as a gate electrode part 36 corresponds to transistors TR23 among the above described transistors. Though no transistors are formed in N well region 21 in FIGS. 9 and 10, since a memory cell region B and a word line driver band A are arranged in alternation, there may be a case where, for example, a driver transistor TR22 is located in N well 21 shown in FIGS. 12 and 16 while a driver transistor TR23 is located in shallow P well 20.

Figure 13:
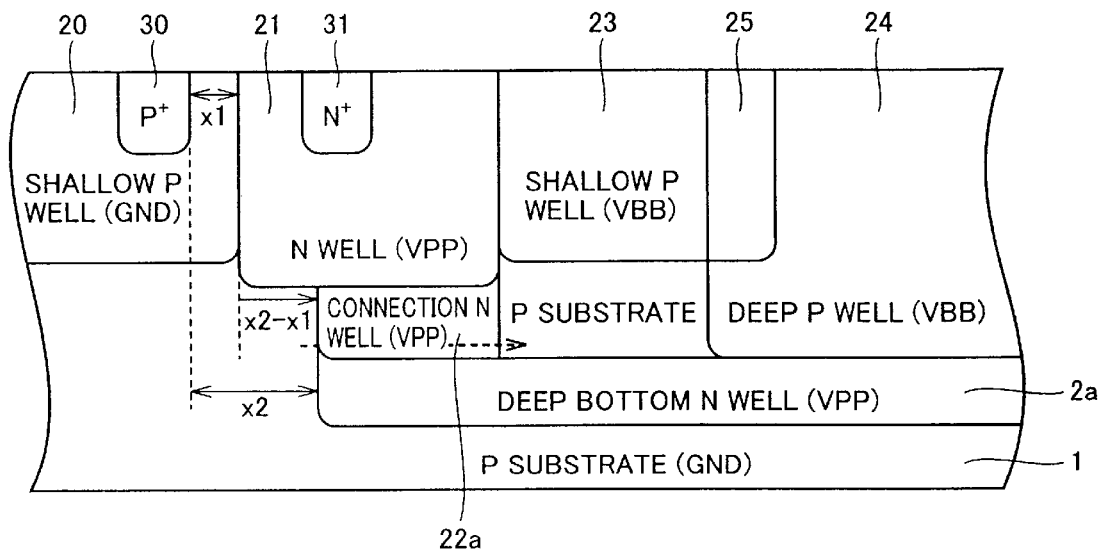
FIG. 13 is a cross section view for describing the scaling down of the layout of the semiconductor device according to the second embodiment.

As shown in FIG. 10 (within frame A), FIG. 13, and the like, the edge parts of deep bottom well 2a and connection N well 22a on the side of shallow P well 20 are, respectively, recessed in the direction away from shallow P well 20.

In particular, since N well 21, connection N well 22a and deep bottom N well 2a are at the same potential (VPP), connection N well 22a and deep bottom N well 2a can be recessed without being affected by the location of $N^+$ region 31 formed in N well 21.

On the other hand, in the case that the respective edge parts of deep bottom well 2a and connection N well 22a are recessed to too great a degree, a current leaks from a region of P type semiconductor substrate 1 located directly beneath N well 21 toward a region of the P type semiconductor substrate located directly beneath shallow P well 23 via connection N well 22a. Accordingly, as for the distance of recess of the edge parts, it is necessary to make the distance such that no current leaks occur in that manner.

Figure 16:
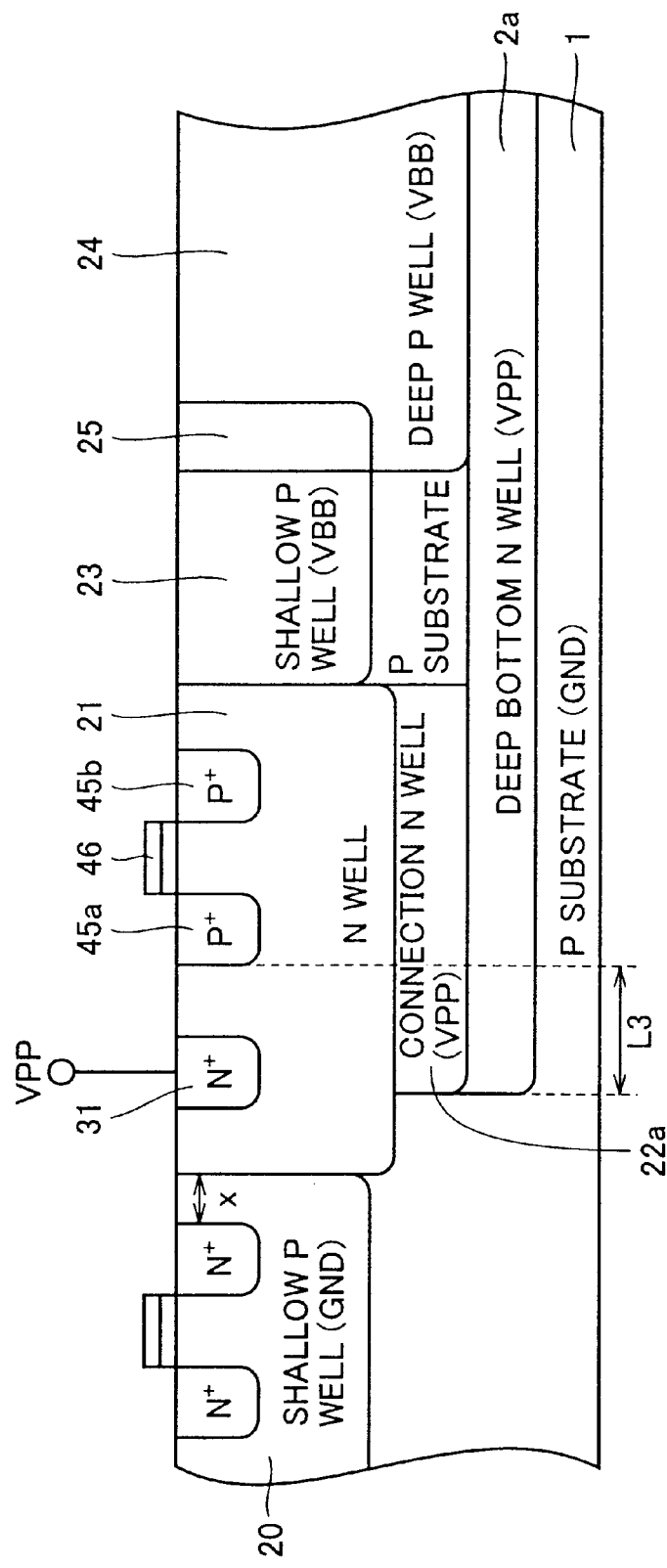
FIG. 16 is a cross section view showing another configuration of a semiconductor device according to the second embodiment.
Figure 17:
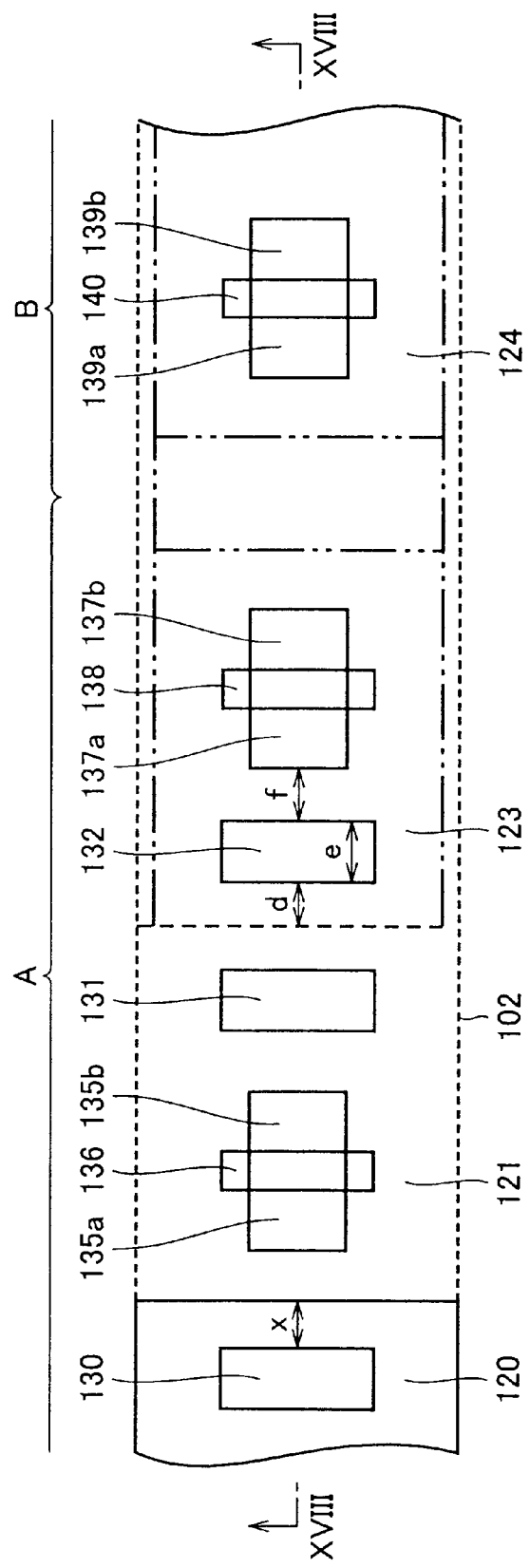
FIG. 17 is a plan view of a semiconductor device according to a prior art.

In addition, as shown in FIG. 16, in the case that a transistor that includes $P^+$ type source and drain regions 45a and 45b as well as a gate electrode 46 is formed in N well 21, as for the locations of the edge parts of connection N well 22a and deep bottom N well 2a, it is necessary for distance L3 between the edge parts and the $P^+$ type source and drain region 45a to be a distance that does not affect the characteristics of the transistor.

As shown in FIGS. 9, 10 and 13, in the case that the distance from $P^+$ type region 30 to the edge parts of connection N well 22a and of deep bottom N well 2a is assumed to be X2, the edge parts of connection N well 22a and of deep bottom N well 2a are recessed by distance (X2−X1) in this case so that space X1 between $P^+$ type region 30 and N well 21 (or the edge part of shallow P well 20) can be made shorter than space X between $P^+$ regions 130, 150 and N well 121 (or the edge part of shallow P well 120) in the conventional semiconductor device shown in FIGS. 18 and 20. This is described below.

Figure 14:
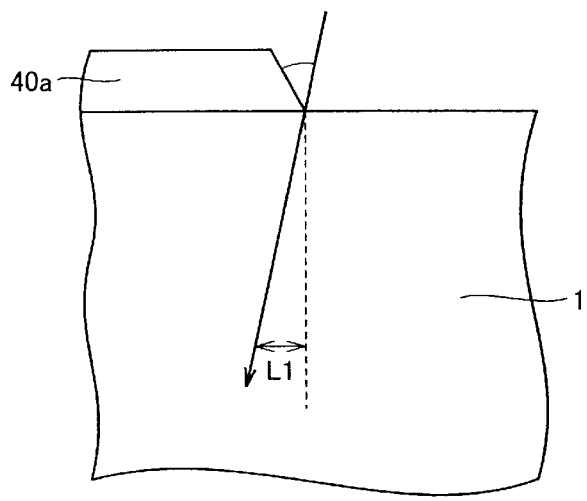
FIG. 14 is a cross section view for describing the dispersion of the location of the well in the case that a comparatively deep well is formed according to the second embodiment.

As has already been described, wells are formed by injecting ions into a semiconductor substrate. Then, N well 21 is shallower than connection N well 22a and deep bottom N well 2a. First, as shown in FIG. 14, in the case that a comparatively deep well is formed, a resist 40a, used as a mask, is comparatively thick and the inclination of the edge part of resist 40a is comparatively large. In addition, the distance that the ions travel through the semiconductor substrate is long. Therefore, dispersion L1 of the location of the edge part of the well relative to the position of the edge part of resist 40a becomes comparatively large.

Figure 15:
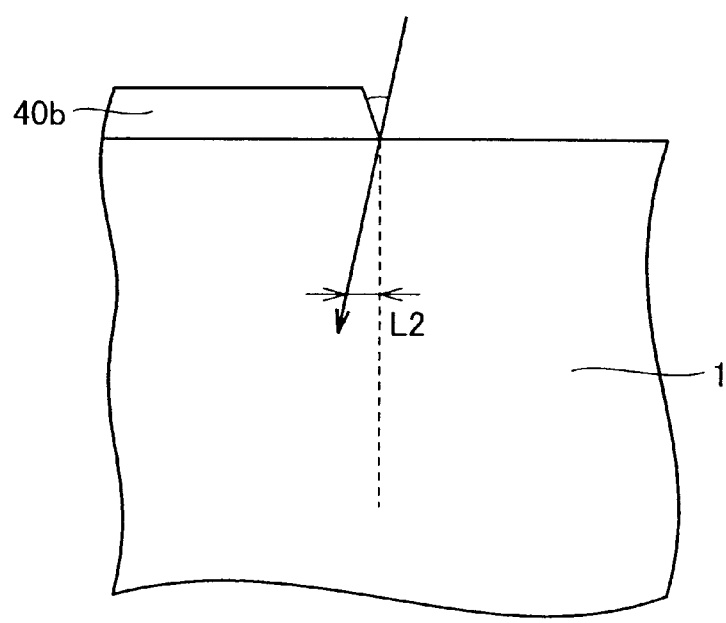
FIG. 15 is a cross section view for describing the dispersion of the location of the well in the case that a comparatively shallow well is formed according to the second embodiment.

On the other hand, in the case that a comparatively shallow well is formed, as shown in FIG. 15, a resist 40b, used as a mask, is comparatively thin and the inclination of the edge part of resist 40b is comparatively small. In addition, the distance that the ions travel through the semiconductor substrate is also short. Therefore, dispersion L2 of the location of the edge part of the well relative to the location of the edge part of resist 40b becomes small in comparison with dispersion L1.

In this manner, the dispersion of the location of N well 21 becomes small in comparison with the dispersion of the positions of connection N well 22a and deep bottom N well 2a.

In the case of this semiconductor device, by making connection N well 22a and deep bottom N well 2a recessed in the direction away from P well 20, the effects of the dispersion of the locations of connection N well 22a and of deep bottom N well 2a are eliminated in the vicinity of the shallow P well. Thereby, space X1 between $P^+$ region 30 and N well 21 (or the edge part of shallow P well 20) can be made shorter than space X in the conventional semiconductor device.

As a result, in the present semiconductor device, in comparison with the conventional semiconductor device, the size of distance (X−X1) can be scaled down in peripheral circuit region A.

In DRAMs, as shown in FIG. 6, memory cell arrays (M/C) and word line driver bands (WD) are arranged in a sub-memory band. Accordingly, in this case, the size of the distance, gained by multiplying distance (X−X1) that can be scaled down for one word line driver band (WD) by the number of the word line driver bands (WD), which are arranged based on a predetermined capacitance, can be scaled down.

In this manner, the scaling down of the layout of the entirety of the DRAM can be easily achieved and a higher integration and further increase in the density of the DRAM can be achieved.

The embodiments disclosed herein are illustrative in all respects and should be not be considered to be Imitative. The present invention is not defined by the above description but is defined by the claims and is intended to include the equivalent meaning of the scope and all of the modifications within the scope of the claims.

What is claimed is:

1. A semiconductor device comprising:
   a semiconductor substrate of a first conductive type having a main surface;
   a first well region of the first conductive type that is formed of a predetermined depth in said main surface of said semiconductor substrate and wherein first semiconductor elements are provided;
   a second well region of the first conductive type that is formed in said main surface of said semiconductor substrate so as to partially overlap an edge part of said first well region, that is shallower than said first well region and wherein second semiconductor elements are provided; and
   a first voltage application part that is formed in a region where said first well region and said second well region overlap and to which a voltage for fixing said first well region and said second well region at a predetermined potential is applied.

2. The semiconductor device according to claim 1, wherein
   the impurity concentration of the region where said first well region and said second well region overlap is higher than the impurity concentration of regions of said first well region and said second well region that do not overlap each other.

3. The semiconductor device according to claim 2, wherein
   said first semiconductor elements include memory cell transistors in memory cells of a dynamic random access memory, and
   said second semiconductor elements include transistors arranged in the periphery of said memory cells.

4. The semiconductor device according to claim 3, comprising:

a third well region of the first conductive type formed in said main surface of said semiconductor substrate on the side opposite to said first well region at a distance from said second well region;

a fourth well region of a second conductive type that is formed in a region ranging from, at least, the surface of a region of said semiconductor substrate located between said second well region and said third well region to a region of said semiconductor substrate located beneath said first well region and said second well region in order to electrically insulate said first well region and said second well region from said third well region; and a second voltage application part that is formed in said third well region and to which a voltage for fixing said third well region at a predetermined potential is applied, wherein a part of said fourth well region located deep in said main surface on the side of said third well region is recessed in the direction away from said third well region.

5. The semiconductor device according to claim 4, wherein the distance by which said part of said fourth well region located deep is recessed from said third well region is a distance that prevents a current from leaking between a region of said semiconductor substrate located beneath said third well region and a region of said semiconductor substrate located between said second well region and said fourth well region.

6. The semiconductor device according to claim 2, comprising:

a third well region of the first conductive type formed in said main surface of said semiconductor substrate on the side opposite to said first well region at a distance from said second well region;

a fourth well region of a second conductive type that is formed in a region ranging from, at least, the surface of a region of said semiconductor substrate located between said second well region and said third well region to a region of said semiconductor substrate located beneath said first well region and said second well region in order to electrically insulate said first well region and said second well region from said third well region; and a second voltage application part that is formed in said third well region and to which a voltage for fixing said third well region at a predetermined potential is applied, wherein a part of said fourth well region located deep in said main surface on the side of said third well region is recessed in the direction away from said third well region.

7. The semiconductor device according to claim 6, wherein the distance by which said part of said fourth well region located deep is recessed from said third well region is a distance that prevents a current from leaking between a region of said semiconductor substrate located beneath said third well region and a region of said semiconductor substrate located between said second well region and said fourth well region.

8. The semiconductor device according to claim 1, wherein said first semiconductor elements include memory cell transistors in memory cells of a dynamic random access memory, and said second semiconductor elements include transistors arranged in the periphery of said memory cells.

9. The semiconductor device according to claim 8, comprising:

a third well region of the first conductive type formed in said main surface of said semiconductor substrate on the side opposite to said first well region at a distance from said second well region;

a fourth well region of a second conductive type that is formed in a region ranging from, at least, the surface of a region of said semiconductor substrate located between said second well region and said third well region to a region of said semiconductor substrate located beneath said first well region and said second well region in order to electrically insulate said first well region and said second well region from said third well region; and a second voltage application part that is formed in said third well region and to which a voltage for fixing said third well region at a predetermined potential is applied, wherein a part of said fourth well region located deep in said main surface on the side of said third well region is recessed in the direction away from said third well region.

10. The semiconductor device according to claim 9, wherein the distance by which said part of said fourth well region located deep is recessed from said third well region is a distance that prevents a current from leaking between a region of said semiconductor substrate located beneath said third well region and a region of said semiconductor substrate located between said second well region and said fourth well region.

11. The semiconductor device according to claim 1, comprising:

a third well region of the first conductive type formed in said main surface of said semiconductor substrate on the side opposite to said first well region at a distance from said second well region;

a fourth well region of a second conductive type that is formed in a region ranging from, at least, the surface of a region of said semiconductor substrate located between said second well region and said third well region to a region of said semiconductor substrate located beneath said first well region and said second well region in order to electrically insulate said first well region and said second well region from said third well region; and a second voltage application part that is formed in said third well region and to which a voltage for fixing said third well region at a predetermined potential is applied, wherein a part of said fourth well region located deep in said main surface on the side of said third well region is recessed in the direction away from said third well region.

12. The semiconductor device according to claim 11, wherein the distance by which said part of said fourth well region located deep in said main surface is recessed from said third well region is a distance that prevents a current from leaking between a region of said semiconductor substrate located beneath said third well region and a region of said semiconductor substrate located between said second well region and said fourth well region.

13. A semiconductor device comprising:
- a semiconductor substrate of a first conductive type having a main surface;
- a first well region of the first conductive type formed of a predetermined depth in the main surface of said semiconductor substrate;
- a voltage application part that is formed in said first well region and to which a voltage for fixing said first well region at a predetermined potential is applied; and
- a second well region of a second conductive type that is formed in said main surface of said semiconductor substrate so as to adjoin said first well region and that is deeper than said first well region, wherein
  - a deeply located part of said second well region on the side of said first well region is recessed in the direction away from said first well region.

14. The semiconductor device according to claim 13, wherein
- said second well region is formed, in order to electrically insulate a predetermined region in said semiconductor substrate from said first well region, so as to surround said predetermined region from said main surface and from the inside of said semiconductor substrate, and
- the distance by which said deeply located part of said second well region is recessed from said first well region is a distance that prevents a current from leaking between a region of said semiconductor substrate located beneath said first well region and said predetermined region.

15. The semiconductor device according to claim 14, wherein
- said second well region includes:
  - an upper well region located in the vicinity of said main surface;
  - a bottom well region that extends toward the side opposite to the side of said first well region and which is formed of a predetermined depth in said main surface; and
  - a connection well region that electrically connects said upper well region and said bottom well region, wherein
    - said deeply located part includes said bottom well region and said connection well region.

16. The semiconductor device according to claim 13, wherein
- said second well region includes:
  - an upper well region located in the vicinity of said main surface;
  - a bottom well region that extends toward the side opposite to the side of said first well region and which is formed of a predetermined depth in said main surface; and
  - a connection well region that electrically connects said upper well region and said bottom well region, wherein
    - said deeply located part includes said bottom well region and said connection well region.

* * * * *